(12) United States Patent
Zhou et al.

(10) Patent No.: US 7,936,582 B1
(45) Date of Patent: May 3, 2011

(54) E-FUSE READ CIRCUIT WITH DUAL COMPARATORS

(75) Inventors: Shidong Zhou, Milpitas, CA (US); Gubo Huang, Milpitas, CA (US)

(73) Assignee: Xilinx, Inc., San Jose, CA (US)

( * ) Notice: Subject to any disclaimer, the term of this patent is extended or adjusted under 35 U.S.C. 154(b) by 348 days.

(21) Appl. No.: 12/051,806

(22) Filed: Mar. 19, 2008

(51) Int. Cl.
*G11C 17/00* (2006.01)
*G11C 7/00* (2006.01)

(52) U.S. Cl. ............ 365/96; 365/189.07; 365/205; 365/225.7

(58) Field of Classification Search ......... 365/230.03, 365/230.06, 200, 225.7, 189.07, 189.09, 365/96, 163, 205; 438/281, 218
See application file for complete search history.

(56) References Cited

U.S. PATENT DOCUMENTS

| | | | | |
|---|---|---|---|---|
| 6,567,333 B2* | 5/2003 | Toda | ............ | 365/225.7 |
| 6,920,070 B2* | 7/2005 | Imai | ............ | 365/225.7 |
| 7,129,769 B2* | 10/2006 | Dixon et al. | ............ | 365/225.7 |
| 7,136,322 B2* | 11/2006 | Brennan et al. | ............ | 365/225.7 |
| 7,224,633 B1* | 5/2007 | Hovis et al. | ............ | 365/225.7 |
| 7,263,010 B2* | 8/2007 | Iwai et al. | ............ | 365/200 |
| 7,277,350 B2* | 10/2007 | Huckaby et al. | ............ | 365/225.7 |
| 7,397,714 B2* | 7/2008 | Nagai et al. | ............ | 365/225.7 |
| 7,411,818 B1* | 8/2008 | Elmegreen et al. | ............ | 365/163 |
| 7,489,180 B2* | 2/2009 | Marshall | ............ | 365/96 |
| 7,501,879 B1* | 3/2009 | Oh et al. | ............ | 365/225.7 |
| 7,598,749 B1* | 10/2009 | Ang et al. | ............ | 365/225.7 |
| 7,659,168 B2* | 2/2010 | Hsu et al. | ............ | 438/281 |
| 7,672,185 B2* | 3/2010 | Allen et al. | ............ | 365/225.7 |
| 7,688,664 B2* | 3/2010 | Yamaguchi | ............ | 365/225.7 |
| 7,701,226 B2* | 4/2010 | Kaneko | ............ | 365/225.7 |

* cited by examiner

*Primary Examiner* — Trong Phan
(74) *Attorney, Agent, or Firm* — Scott Hewlett; LeRoy D. Maunu

(57) ABSTRACT

An integrated circuit has an E-fuse sense circuit configured to produce a READ voltage according to a fuse resistance of an E-fuse during a READ operation. The integrated circuit also has a reference sense circuit configured to produce a reference voltage according to a reference resistance of an on-chip reference resistor during the READ operation. The reference sense circuit replicates the E-fuse sense circuit. The E-fuse sense circuit and the reference sense circuit are coupled to a comparator that produces a bit value according to a difference between the READ voltage and the reference voltage.

20 Claims, 6 Drawing Sheets

E-FUSE READ CIRCUIT WITH DUAL COMPARATORS

FIELD OF THE INVENTION

This invention relates generally to integrated circuits, and more particularly to techniques for reading the data value of electronically programmable fuses in integrated circuits.

BACKGROUND OF THE INVENTION

One-time-programmable ("OTP") memory elements are used in integrated circuits ("IC") to provide non-volatile memory ("NVM"). Data in NVM are not lost when the IC is turned off. NVM allows an IC manufacturer to store lot number and security data on the IC, for example, and is useful in many other applications. Devices commonly known as fuses and anti-fuses are examples of OTP memory elements.

Unfortunately, the types of fuses and anti-fuses commonly used in memory IC, such as read-only memory ("ROM") ICs typically use processes and materials that are not used in a standard complementary metal-oxide-semiconductor ("CMOS") ICs. Electronically programmable fuses ("E-fuses") have been developed that can be incorporated in an IC using typically CMOS fabrication techniques.

FIG. 1A is a plan view of an E-fuse element 100. The E-fuse 100 has a fuse link 102 between a first fuse terminal (anode) 104 and a second fuse terminal (cathode) 106. The anode, fuse link, and cathode are typically polysilicon or silicided polysilicon formed entirely on relatively thick field oxide or isolation oxide. Contacts (not shown) provide electrical terminals to the anode and cathode. The fuse link has a fuse link length $FL_L$ and a fuse link width $FL_W$. The fuse link has a relatively small cross section, which is essentially defined by the thickness of the material in which the fuse link is formed in and by the fuse link width. The fuse link width $FL_W$ is often the critical dimension (e.g., minimum polysilicon dimension) of the technology used to fabricate the IC. The small cross section of the fuse link results in Joule heating of the link during programming to convert the E-fuse to a high-resistance state.

The terms "anode" and "cathode" are used for purposes of convenient discussion. Whether a terminal of an E-fuse operates as an anode or a cathode depends upon how the programming current is applied. Programming of the E-fuse can be facilitated by the physical layout. For example, the cathode 106 is larger than the fuse link 102, which generates localized Joule heating in the fuse link during programming.

During programming, current is applied through the fuse link for a specified period. The programming current heats up the fuse link more than the adjacent areas due to current crowding and differences in heat dissipation, creating a temperature gradient. The temperature gradient and the carrier flux causes electro- and stress-migration to take place and drive material (e.g., silicide, dopant, and polysilicon) away from the fuse link, and in some cases physically separates ("blows") portions of the fuse link. Programming generally converts the E-fuse from an original (low) resistance to a programmed (high) resistance.

FIG. 1B is a side view of the E-fuse 100 of FIG. 1A. The E-fuse 100 is fabricated from a layer of link material 101 that is deposited on the IC substrate and patterned using photolithographic techniques to define the anode 104, cathode 106, and fuse link 102. The fuse link 102 has a fuse link thickness $FL_T$ that is essentially the thickness of the layer of link material 101. The E-fuse is on field oxide 108 that is formed on semiconductor material 110 (e.g., silicon).

FIG. 1C shows a prior art circuit 120 for reading the data value of an E-fuse 122 (i.e., whether the E-fuse is in its original state or a programmed state). A first logic state (e.g., a logical "0") is typically assigned to an unprogrammed, low-resistance (typically about 100 Ohms) fuse state, and a second logic state (e.g., a logical "1") to the programmed, high-resistance (typically between about 2,000 Ohms and about 8,000 Ohms) fuse state. The change in resistance is sensed (read) by a sensing circuit to produce a data bit.

When a READ enable signal ($READ_{EN}$) is applied, transistors TN1, TN2 and TN3 are turned on. Transistor TP1 is on, and READ current $I_{READ}$ flows through transistors TP1, TN1, TN2, and TN3 (which will be referred to as a sense circuit for purposes of discussion), and through the E-fuse 122. If the E-fuse 122 is in a pristine (i.e., the unprogrammed low-resistance) state, the voltage at trip node 124 is relatively low. If the E-fuse has been programmed to a high-resistance state, the voltage at trip node 124 is higher. The inverter 126 is designed to trip from one data value to another. In other words, the inverter 126 is designed to transition from a first output state (e.g., digital value 1) to a second output state (e.g., digital value 0) at a selected input voltage. The input voltage at which the inverter 126 trips is selected to be between the voltage expected at trip node 124 when the E-fuse is in a pristine state, and the voltage expected at trip node 124 when the E-fuse has been programmed.

The output of inverter 126 is coupled to a pass gate 128 that reads the data out of the inverter, and then to an inverting latch 130. The second inverter 132 in the output path flips the data value from the first inverter 126 back to the data value sensed at the input (node 124) of the first inverter 126. Thus, the data value stored in the E-fuse 122 is provided to the output 134 of the sense circuit 120 as output data $D_{OUT}$. The portion of the circuit 100 between the trip node 124 and data output 134 will be referred to as the output path or latched output path for purposes of discussion.

Unfortunately, fabrication process variations, programming process variations, and operating temperature variations can affect the accuracy of the trip point, and thus the fidelity of the output data $D_{OUT}$. For example, the post-programming resistance can be between a few thousand Ohms and several thousand Ohms for some E-fuses, which can lead to variations in the voltage established at the trip node 124 during a READ operation. Similarly, the temperature of the inverter 126 can affect the input voltage at which the inverter output changes state. Also, the operation of the sense circuit of PMOS and NMOS transistors can vary due to process fabrication and operating voltage, and operating temperature (commonly called "PVT" variation).

E-fuse elements are particularly useful due to their simplicity, low manufacturing cost, and easy integration into CMOS ICs using conventional CMOS fabrication techniques. However, an incorrect READ operation can result in data errors, and accurate reading of E-fuses is critical. It is desirable to provide E-fuse reading techniques that are more accurate compared to those of the prior art.

SUMMARY OF THE INVENTION

An integrated circuit has an E-fuse sense circuit configured to produce a READ voltage according to a fuse resistance of an E-fuse during a READ operation. The integrated circuit also has a reference sense circuit configured to produce a reference voltage according to a reference resistance of an on-chip reference resistor during the READ operation. The reference sense circuit replicates the E-fuse sense circuit. The E-fuse sense circuit and the reference sense circuit are coupled to a comparator that produces a bit value according to a difference between the READ voltage and the reference voltage.

DETAILED DESCRIPTION OF THE DRAWINGS

Figure 1A:
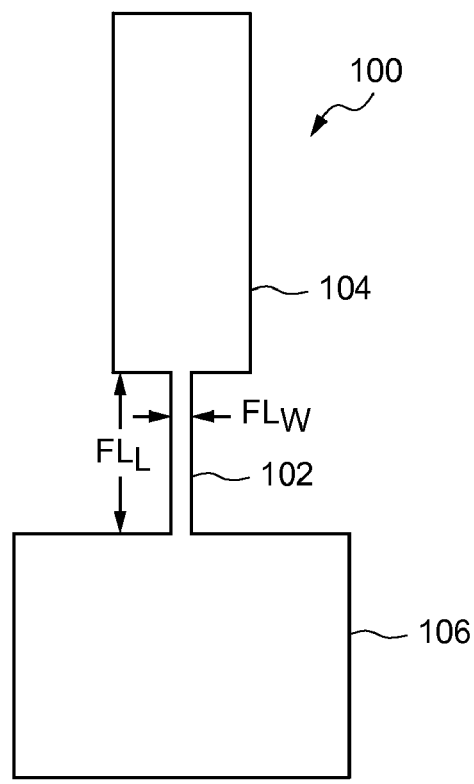
FIG. 1A is a plan view of a prior art E-fuse.
Figure 1B:
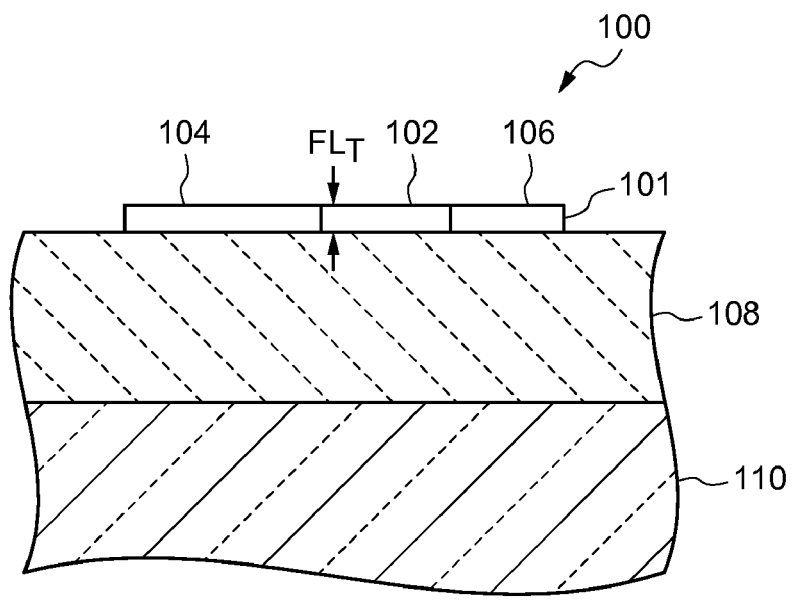
FIG. 1B is a side view of the E-fuse of FIG. 1A.
Figure 1C:
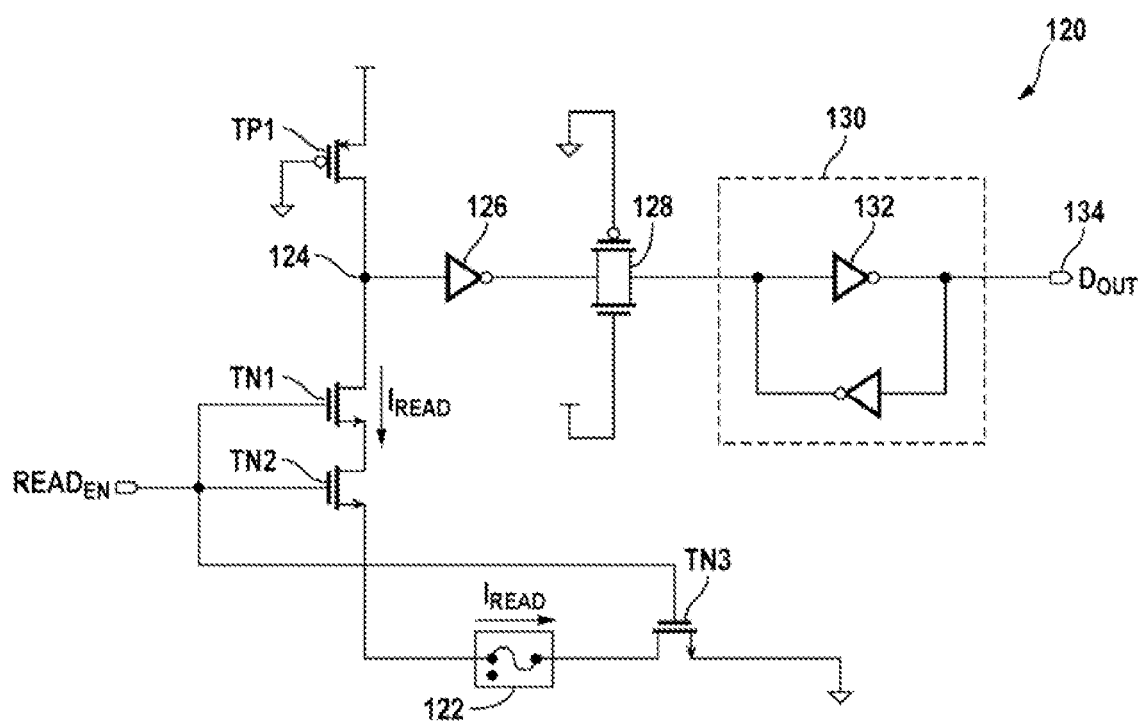
FIG. 1C shows a prior art circuit for reading the data value of an E-fuse 122.
Figure 2A:
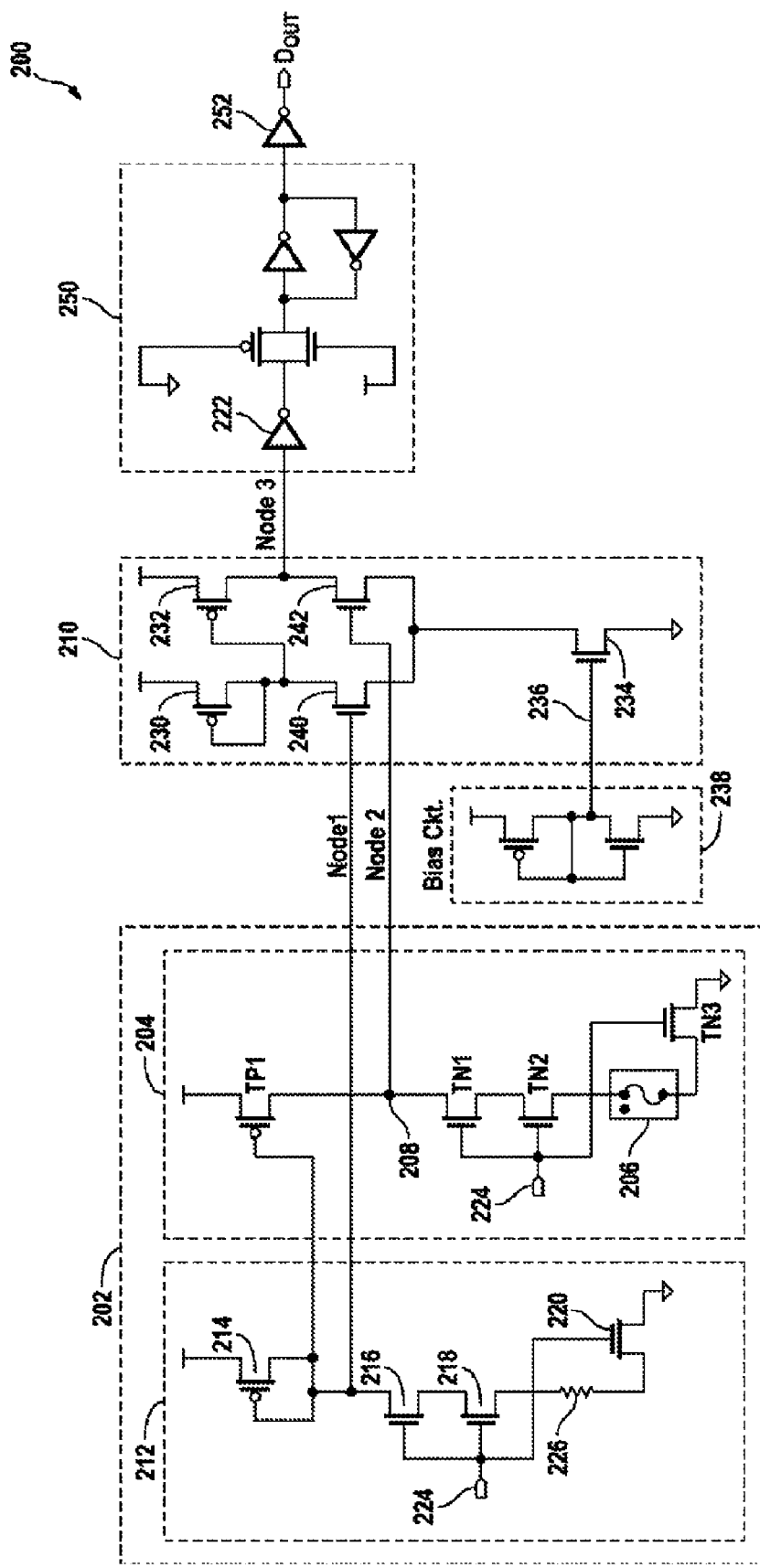
FIG. 2A is a circuit diagram of a dual-comparator E-fuse READ circuit according to an embodiment of the invention.

FIG. 2A is a circuit diagram of a dual-comparator E-fuse READ circuit 200 according to an embodiment of the invention. The READ circuit 200 uses a first comparator circuit 202 that includes an E-fuse sense circuit 204 similar to the sense circuit formed by TP1, TN1, TN2, TN3 and E-fuse 206 described in reference to FIG. 1C, except that the gate of TP1 is not grounded, but rather tied to the drain (diode connected) and gate of transistor 214, and the node 208 is coupled to a second comparator 210, rather than the input of an inverter (compare, ref. num. 222). Diode connecting the gates of TP1 and PMOS 214 to the drain of PMOS 214 provides better gain for the first comparator 202. A minor difference between the resistor 226 and the E-fuse 206 will be amplified at nodes 1 and 2. The first comparator circuit 202 also includes a reference sense circuit 212. The E-fuse sense circuit 204 is often referred to as an E-fuse cell, which are typically repeated in a row-and-column fashion to form an E-fuse memory array.

Transistors 214, 216, 218, and 220 of the reference bias circuit 212 are arranged in a corresponding manner to TP1, TN1, TN2, and TN3 of the E-fuse READ bias circuit 204 except that, instead of an E-fuse, an on-chip reference resistor 226 is in the reference sense circuit 212. In a particular embodiment, the reference resistor 226 is made from the same thin film layer (e.g., polysilicon or silicide) that is used to fabricate the E-fuse link. In a further embodiment, the reference resistor is a polysilicon or silicide resistor that has a resistance about ten times greater than the as-fabricated (also known as pristine or unprogrammed) resistance of the E-fuse. In a particular embodiment, a polysilicon E-fuse has an as-fabricated resistance of about 100 Ohms, and a polysilicon reference resistor has a resistance of about 1,000 Ohms.

The PMOS transistor 214 and NMOS transistors 216, 218, 220 in the reference sense path are designed to be essentially identical to the equivalent MOS transistors TP1, TN1, TN2, TN3 in the E-fuse sense path. This insures that fabrication tolerances, which normally occur as a result of typical fabrication process specification windows, are represented in each sense path and that each sense path is similarly affected by operating temperature. In a particular embodiment, the reference sense circuit is located in close proximity to the E-fuse cell, so that the reference sense circuit is operating at essentially the same temperature as the E-fuse sense circuit. In a particular embodiment, an E-fuse memory array has E-fuse cells laid out in a row and column fashion, each cell being individually accessible using wordline/bitline techniques, and the reference sense circuit is at a perimeter edge of the E-fuse memory array, such as at an end of a row or column.

In a typical application, the reference sense circuit, second comparator, and sense output circuit 250 are used to read several E-fuse cells by selectively accessing the desired E-fuse cell in an E-fuse memory array and coupling the output (i.e., node 2) of the E-fuse cell to second comparator circuit 210, along with a reference voltage generated at node 1 during a READ operation.

To read the data value of the E-fuse 206, a READ enable signal (compare, FIG. 1C, READ$_{EN}$) is applied to node 224, which is present in both reference cell 212 and E-fuse cell 204. The current path in each cell is similar, and the reference voltage generated at node 1 tracks the read voltage generated at node 2 because the transistors in each path are concurrently fabricated during the CMOS IC fabrication process, and each see very similar, and in many cases essentially the same, ambient temperature during a READ operation. In an exemplary embodiment, the reference cell(s) are fabricated along a perimeter edge of an E-fuse memory cell array, which avoids wafer runout and process variation issues so that the transistors in the reference cell are very physically similar to the transistors in the E-fuse cell. This produces a reference voltage that tracks the read voltage as the bias of the IC or the operating temperature of the IC changes.

The reference cell 212 has a reference resistor 226 with a value chosen to be between the expected resistance of an unprogrammed E-fuse and the expected resistance of a programmed E-fuse (e.g., the lowest acceptable programmed resistance). In a particular embodiment, the reference resistance is about ten times the as-fabricated (i.e., unprogrammed) resistance of the E-fuse 206. In a particular embodiment, the as-fabricated resistance of the E-fuse 206 is about 100 Ohms, and the reference resistor 226 is about 1000 Ohms. Choosing a reference resistor that is about ten times the unprogrammed fuse resistance provides a reference voltage at node 1 that easily differentiates between data states of the E-fuse (i.e., produces a sufficiently large voltage swing). In an exemplary application, a correctly programmed E-fuse has a resistance of between about 4,000 Ohms and 8,000 Ohms. In a particular embodiment, the reference resistor is selected to have a greater difference (e.g., a factor of 10:1) between the unprogrammed, low-resistance fuse state than the difference (e.g. a factor of 1:4) between the high-resistance fuse state. Alternatively, a difference between the reference resistor and unprogrammed E-fuse is about 5:1, or a difference between the reference resistor and a programmed E-fuse is about 1:2. If the difference becomes too small, the voltage swing on node 3 becomes undesirably small. In yet another embodiment, the reference resistor is not more than half the lowest expected programmed resistance of an E-fuse.

If the E-fuse is unprogrammed (i.e., has a resistance of about 100 Ohms), during a READ operation node 1 has a higher voltage than node 2 because the reference resistance is much higher than the E-fuse resistance, and the fuse cell and reference cell bias paths are essentially identical (i.e., matched). If the E-fuse is programmed to even the minimum allowable resistance (e.g., 4000 Ohms), the voltage at node 2 is higher than the voltage at node 1. Even if the E-fuse is poorly programmed (i.e., is programmed to a resistance less than 4,000 Ohms), the READ circuit 200 can differentiate the data value (bit) stored in the E-fuse, even if the programmed E-fuse resistance is as low as 1,500 Ohms.

During a READ operation, the reference voltage developed at node 1 and the READ voltage developed at node 2 are provided to the second comparator circuit 210. The second comparator circuit 210 is a differential amplifier capable of distinguishing between even small differences between the voltages at node 1 and node 2 by rejecting common mode signals, and providing an output on node 3 indicating whether the higher input voltage was at node 1 or at node 2. Other types of comparator circuits are alternatively used.

The PMOS transistors 230, 232 provide current loading and the NMOS transistor 234 draws an essentially constant current according to the bias 236 generated by the bias circuit 238. If the reference voltage at node 1 is greater than the READ voltage at node 2 (which indicates that the E-fuse 206 is in the as-fabricated, unprogrammed state), NMOS transistor 240 turns on more strongly than NMOS transistor 242 and node 3 goes high. If the E-fuse 206 is in the high-resistance, programmed state, then NMOS transistor 242 turns on more strongly than NMOS transistor 240 and pulls node 3 low.

Node 3 is low for E-fuse resistance values greater than the reference resistor 226. In other words, the same voltage is generated at node 3 whether a programmed E-fuse has a resistance of 2,000 Ohms or 8,000 Ohms, or even 1,500 Ohms. The programmed resistances of E-fuses in an E-fuse memory array can vary significantly depending on minor fabrication and programming differences. However, the voltage on node 3 that is coupled to the inverter 222 is essentially the same for all programmed E-fuses, as long as the programmed resistance is sufficiently above the reference resistance 226.

The output (node 3) of the second comparator circuit 210 is provided to a sense output latch 250. An output inverter 252 is optionally included in the output path; however, the data (bit) value assigned to a fuse state (e.g., whether an unprogrammed fuse is assigned a data value of "1" or "0", and vice versa) is arbitrary.

Referring to transistors TP1, TN1, TN2, and TN3 that form the sense circuit for FIG. 1C, transistor TP1 is always on because its gate is grounded. Current flows from the drain terminal (e.g., $V_{DD}$ or other voltage supply) to the trip node 124. If the resistance of the path from trip node 124 to ground is high (e.g., when any of the NMOS transistors are off or the E-fuse 122 is in a high-resistance state), trip node 124 is lifted to a HI voltage level (basically $V_{DD}$ minus the voltage drop through TP1). If the resistance to ground is low (i.e., when all of the NMOS transistors are ON and the E-fuse is in the low-resistance state), the trip node 124 is pulled to a LOW voltage level. The gate widths and other design and fabrication parameters of the PMOS and NMOS transistors are selected to provide a voltage swing between the HI and LOW states to properly drive the inverter 126 from one data value (e.g., logical "0") to another data value (e.g., logical "1"), as is known in the art of CMOS IC design and fabrication.

However, the balance between the amount of current supplied to trip node 124 by TP1 and the current drawn from trip node 124 by the NMOS transistors TN1, TN2, TN3 in series with the E-fuse (assume a low-resistance state) depends on many fabrication and operating conditions, as discussed above. For example, the conductances of the PMOS and NMOS transistors vary over manufacturing specification ranges to provide relatively weaker or stronger current characteristics. Similarly, operating temperature affects MOSFET performance, and the PMOS and NMOS FETs are likely to be truly balanced at a single temperature or over a temperature range that is much less than the operating temperature range of the CMOS IC.

Figure 2B:
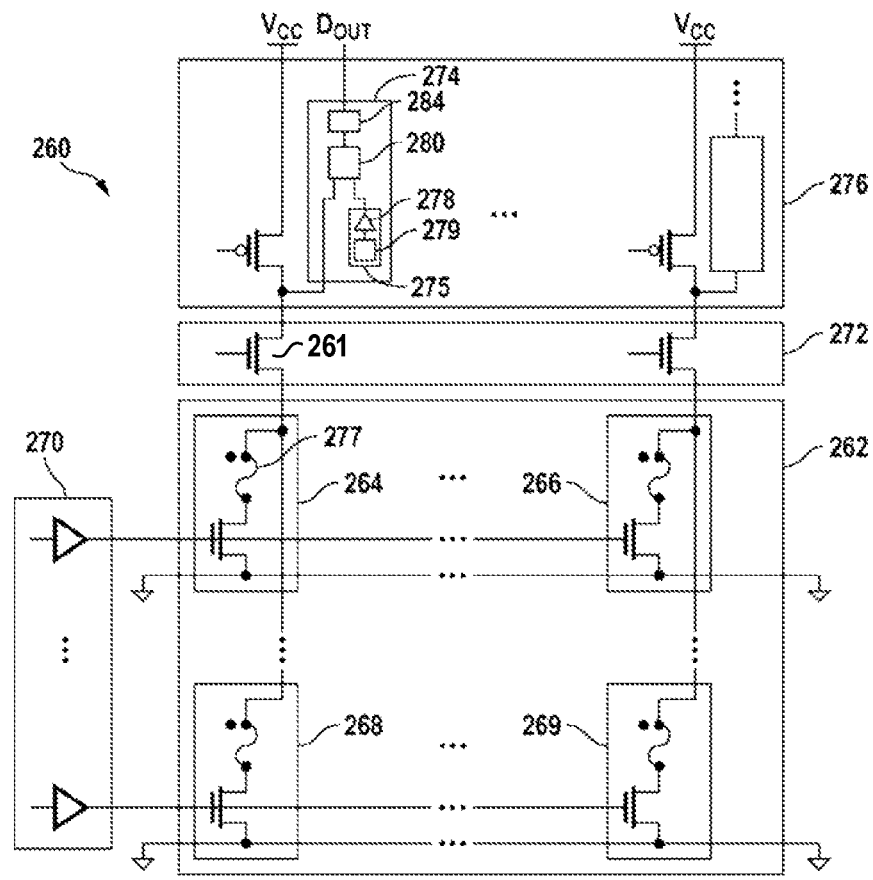
FIG. 2B is a diagram of an IC according to an embodiment of the invention.

FIG. 2B is a diagram of a portion of an IC 260 according to an embodiment of the invention. In a particular embodiment, the IC 260 is a field programmable gate array and the portion of the IC is a memory block. The IC 260 has an E-fuse memory array 262 having E-fuse cells 264, 266, 268, 269 arranged in rows and columns. Decoding circuits (also referred to as decoding drivers) 270, 272 allow accessing individual E-fuse cells in the E-fuse memory array. A word line decoder 270 selects rows (word lines) for programming and reading operations. A bitline READ decoder 272 selects a bitline during a READ operation and couples an output of the selected E-fuse cell (i.e., the cell in the memory array that is on the selected wordline and on the selected bitline) to a sense amplifier 274 in a sense amplifier array 276. Alternative embodiments use other configurations.

Comparing FIG. 2B to FIG. 2A, it is seen that the PMOS and NMOS FETs TP1, TN1, TN2, and TN3 of FIG. 2A are distributed in various functional areas of the memory block of the IC 260 (compare FIG. 2A, ref. num. 204). The READ path of FIG. 2B has a single NMOS transistor 261 instead of the two NMOS transistors TN1 and TN2 of FIG. 2A.

The sense amplifier 274 includes a reference cell 275 (compare FIG. 2A, ref. num. 212) that has a reference sense circuit 278 (compare FIG. 2A, FETs 214, 216, 218, 220) that replicates the READ path, and a reference resistor 279. The reference resistor has a resistance between the expected unprogrammed resistance and the lowest expected programmed resistance of the E-fuse 277. The transistors in the READ path see essentially the same processing conditions, operating voltage, and operating temperature as the transistors in the sense amplifier 274. The sense amplifier also includes a comparator 280, such as a differential amplifier. A READ voltage is provided to a first input of the comparator from the READ path, and a reference voltage is provided to a second input of the comparator from the reference cell 275. The comparator provides a bit value to an output latch 284 (compare FIG. 2A, ref. num. 250). Other E-fuse cells in the column can be read using the sense amplifier by activating a different word line on the bitline.

Figure 3A:
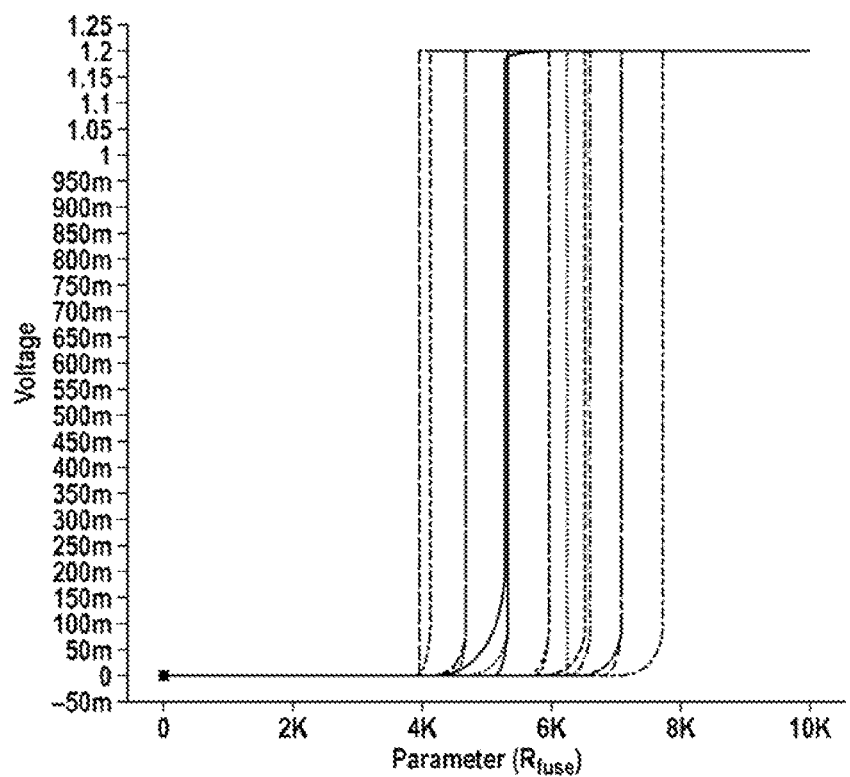
FIG. 3A shows circuit simulation plots of voltages developed at Dout of FIG. 1C for a variety of temperature and fabrication variations.

FIG. 3A shows circuit simulation plots of voltages developed at Dout of FIG. 1C for a variety of temperature and fabrication variations. The circuit simulation modeled the sense amplifier at temperatures between −40° C. and 125° C., and for several different fabrication conditions known to affect the current characteristics of PMOS and NMOS FETs. For each plot, the resistance value of the E-fuse was swept between zero Ohms and 10 k Ohms. Fifteen simulations were run. Individual identification of the fabrication and operating parameters of each plot is omitted for clarity of illustration. What FIG. 3A shows is that variations in the sense amplifier operation arising due to typical fabrication variation and operating temperature range are equivalent to an approximately 4 k Ohm difference in E-fuse resistance.

One way to consider this is that each E-fuse would be required to be programmed to a resistance greater than 8 k Ohms in order to be reliably read over the entire operating temperature range for CMOS ICs fabricated across the range of process parameters. This restricts the types of E-fuses that can be used, and also places stringent requirements on the E-fuse programming process.

Figure 3B:
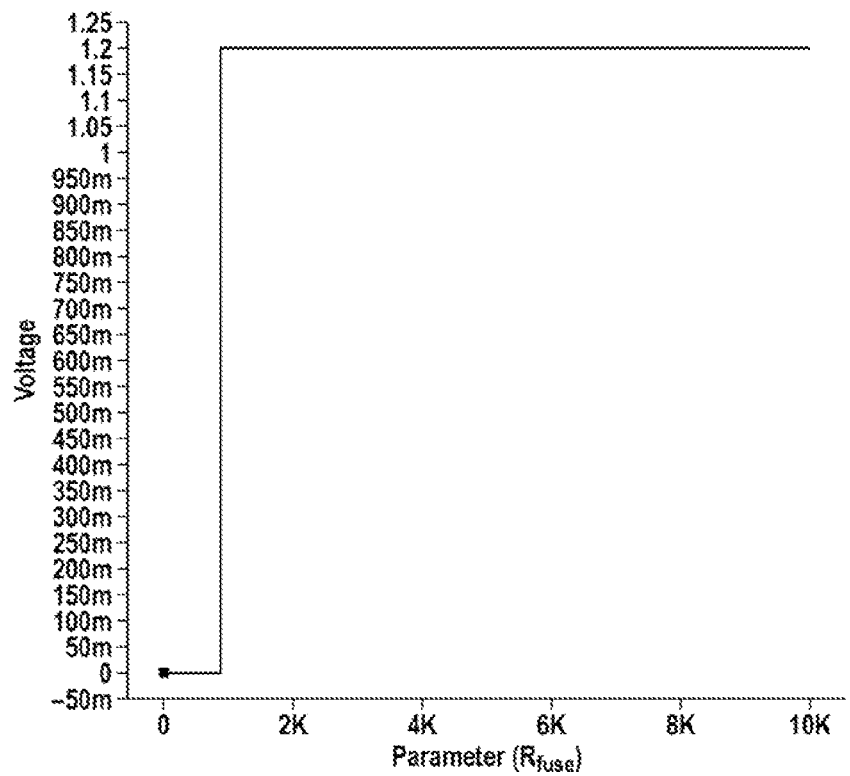
FIG. 3B shows circuit simulation plots of voltages developed at Dout of FIG. 2A for the temperature and fabrication variations simulated in FIG. 3A.

FIG. 3B shows circuit simulation plots of voltages developed at Dout of FIG. 2A over the same temperature and fabrication variations simulated in FIG. 3A. The fifteen separate plots overlie each other and therefore appear as a single plot because Dout transitions from a low state to a high state at approximately 1,000 Ohms over all of the modeled variations. As in the simulations used to generate the plots of FIG. 3A, the resistance of the E-fuse was swept from zero Ohms to 10 k Ohms. For each of the fifteen simulations for the circuit of FIG. 2A, the transition occurred when the resistance of the E-fuse exceeded the resistance of the reference resistor (which was 1,000 Ohms in this simulation model).

FIG. 3B shows that the effects of process variation and operating temperature on the trip point of an E-fuse READ circuit arising from CMOS fabrication process variation and operating temperature can be greatly reduced, and essentially eliminated, using a circuit according to an invention. Whereas a programmed E-fuse should have a resistance greater than 8,000 Ohms to be used with the circuit of FIG. 1C to allow accurate reading by CMOS circuits fabricated over the entire range of process variations and operating temperatures, and should have a programmed resistance of at least 4 k Ohms to be reliably read by any of the CMOS ICs at the most sensitive operating temperature. The same E-fuse would be reliably read using the circuit of FIG. 2A over the same temperature range and for the same process variations even if the programmed E-fuse resistance was much less than 4 k Ohms, and in this example could be almost as low as 1 k Ohm. This provides much greater flexibility in the design of the E-fuse, and accommodates variations in the fabrication and programming processes that are not achieved with the prior art.

Figure 4:
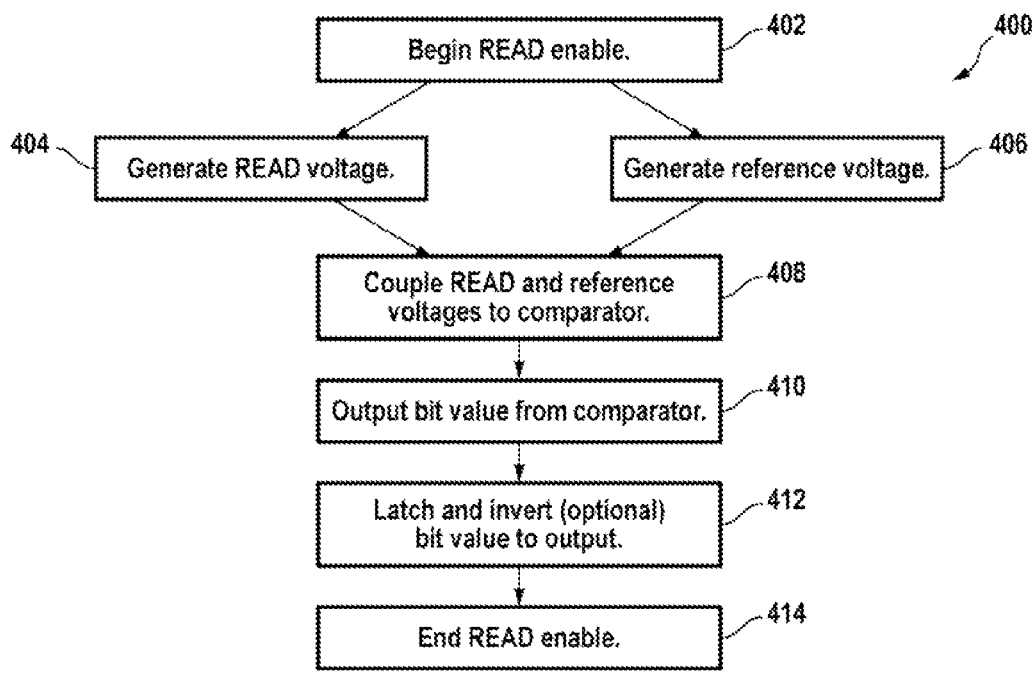
FIG. 4 is a flow chart of a method of operating a CMOS IC having an E-fuse memory array according to an embodiment.

FIG. 4 is a flow chart of a method of operating an IC having an E-fuse memory array according to an embodiment. During a READ operation (step 402), a READ voltage is generated at a first node by a first sense circuit according to a resistance value of an E-fuse (step 404). During the READ operation, a reference voltage is generated at a second node by a second sense circuit according to a reference resistor (step 406). The second sense circuit replicates the first sense circuit to provide similar operational characteristics over the operating temperature of the IC. In a particular embodiment, the READ voltage and the reference voltage are concurrently generated. In a further embodiment, the READ voltage and the reference voltage are generated when a READ enable signal is applied to an E-fuse cell and to a reference cell.

The term "replicate" means that the second sense circuit has essentially the same type and size of MOS FETs as the first sense circuit. This allows the first and second sense circuits to track each other over PVT variations. In a particular embodiment, the E-fuse is in an E-fuse cell of an E-fuse memory array, and the second sense circuit is essentially proximate to an edge of the E-fuse memory array. In a particular embodiment, the reference resistor has a resistance selected to be about ten times the as-fabricated resistance of the E-fuse, which provides quick, reliable differentiation between an unprogrammed E-fuse and a programmed E-fuse, even if the programmed E-fuse has a resistance near, but greater than, the resistance of the reference resistor. In a particular embodiment, the E-fuse has a polysilicon fuse element, and the reference resistor is a polysilicon resistor.

The reference voltage and the READ voltage are coupled to a comparator (step 408), and the comparator outputs a bit value (step 410). In a particular embodiment, the comparator is a differential amplifier. The bit value is coupled to an output through an output circuit (step 412). In an exemplary method, the output has the same logic level as the bit value. In an alternative embodiment, the output has the opposite logic level than the bit value. In other words, the bit value has a first logic state (e.g., 0) and is inverted to provide an output value of the opposite logic state (e.g., 1). In a particular embodiment, the output circuit includes a latch to maintain the output after a READ enable signal has ended (step 414).

In a further embodiment, the E-fuse is in an E-fuse cell of the memory array and is selected to be read during the READ operation by activating a wordline and selecting a bit line that the E-fuse cell shares with other E-fuse cells (see, e.g., FIG. 2B, ref. nums. 264, 268). After the E-fuse is read, a second E-fuse cell on the bitline is selected and a second E-fuse cell is read during a second READ operation by activating a second wordline.

Figure 5:
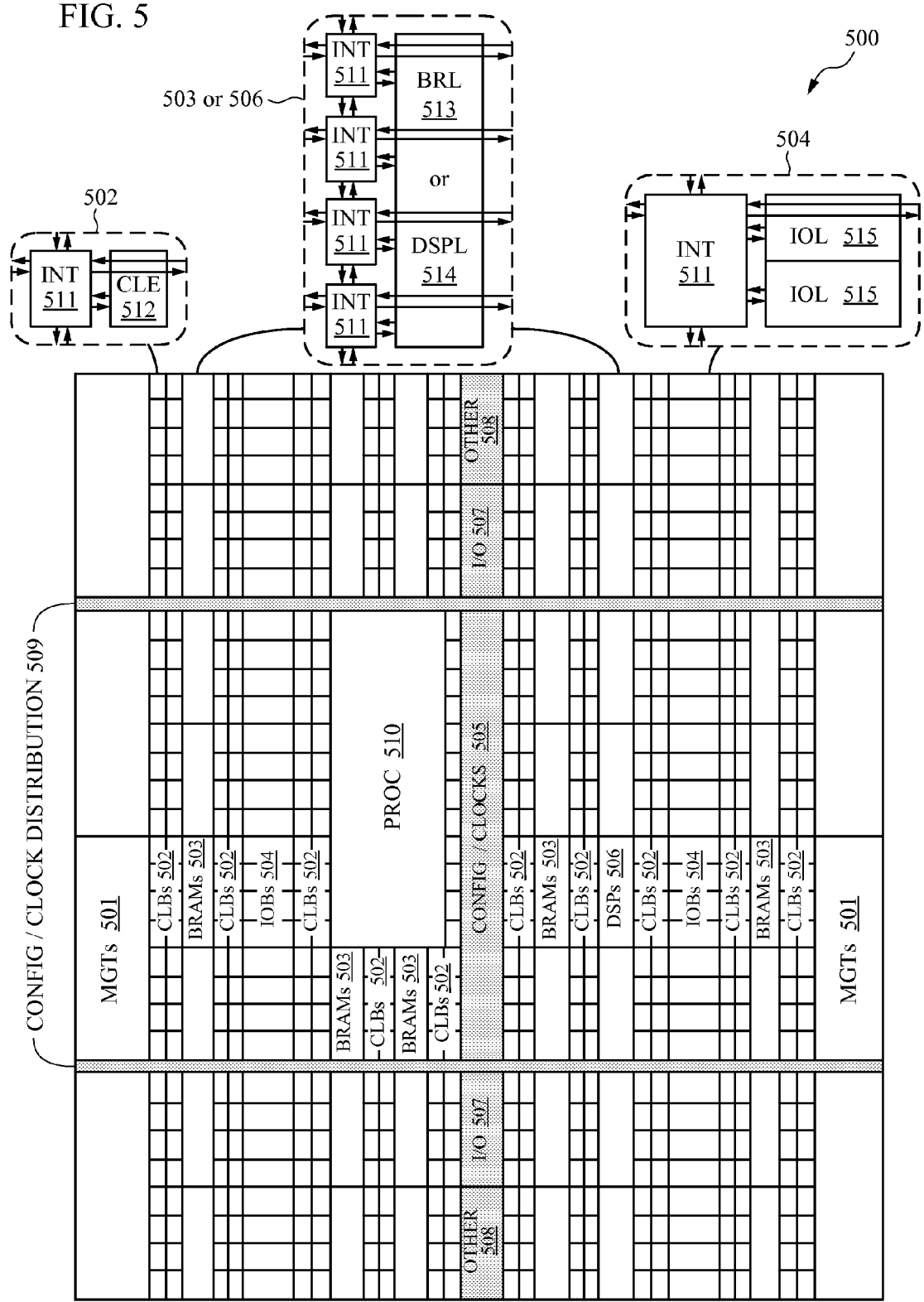
FIG. 5 is a plan view of an FPGA according to an embodiment.

FIG. 5 is a plan view of an integrated circuit 500 according to an embodiment of the invention. The integrated circuit is an FPGA that includes CMOS portions in several of the functional blocks, such as in RAM and logic, and is fabricated using a CMOS fabrication process. E-fuses read according to one or more embodiments of the invention are incorporated in any of several functional blocks of the IC, such as a memory block, logic block, I/O block, clock circuit, transceiver, or other functional block; within many functional blocks; or within a physical section or segment of the FPGA 500. A sense amplifier is optionally included in each E-fuse cell. The FPGA also has at least one reference cell with a sense circuit replicating the sense circuit in the E-fuse cell. In a further embodiment, the FPGA has a variety of types of E-fuses (e.g., different memory arrays use different types of E-fuses). A READ circuit using a reference sense circuit according to an embodiment reliably reads any of several types of E-fuses incorporated in the FPGA.

The FPGA architecture includes a large number of different programmable tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507) (e.g., configuration ports and clock ports), and other programmable logic 508 such as digital clock managers, analog-to-digital converters, system monitoring logic, and so forth. Some FPGAs also include dedicated processor blocks (PROC 510).

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element (INT 511) also includes the connections to and from the programmable logic element within the same tile, as shown by the examples included at the top of FIG. 5.

For example, a CLB 502 can include a configurable logic element (CLE 512) that can be programmed to implement user logic plus a single programmable interconnect element (INT 511). A BRAM 503 can include a BRAM logic element (BRL 513) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 506 can include a DSP logic element (DSPL 514) in addition to an appropriate number of programmable interconnect elements. An IOB 504 can include, for example, two instances of an input/output logic element (IOL 515) in addition to one instance of the programmable interconnect element (INT 511). As will be clear to those of skill in the art, the actual I/O pads connected, for example, to the I/O logic element 515 are manufactured using metal layered above the various illustrated logic blocks, and typically are not confined to the area of the input/output logic element 515. In the pictured embodiment, a columnar area near the center of the die (shown shaded in FIG. 5) is used for configuration, clock, and other control logic.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. Therefore, the spirit and scope of the appended claims should not be limited to the foregoing description.

The invention claimed is:

1. An integrated circuit comprising:
an E-fuse cell memory array including a plurality of E-fuses;
a plurality of E-fuse sense circuits;
wherein each E-fuse sense circuit is coupled to a subset of the plurality of E-fuses, and each E-fuse sense circuit is configured to produce a read voltage according to a fuse resistance of a selected one of the subset of the plurality of E-fuses during a read operation;
a plurality of reference cells disposed along a perimeter edge of the E-fuse memory cell array;
wherein each reference cell includes a reference sense circuit corresponding to one of the plurality of E-fuse sense circuits, and each reference sense circuit is configured to produce a reference voltage according to a reference resistance of an on-chip reference resistor during the read operation, each reference sense circuit replicating the corresponding E-fuse sense circuit; and
a plurality of comparators, each comparator coupled to one of the plurality of the E-fuse sense circuits and to one of the reference sense circuits and configured to produce a bit value according to a difference between the read voltage and the reference voltage.

2. The integrated circuit of claim 1 wherein each E-fuse includes a polysilicon fuse link and the reference resistor is a polysilicon resistor.

3. The integrated circuit of claim 1 further comprising respective sense output latch circuits disposed between the plurality of comparators and a plurality of data outputs.

4. The integrated circuit of claim 1 wherein the E-fuse memory array and the reference sense circuits are in a memory block of a field programmable gate array.

5. The integrated circuit of claim 4 wherein each E-fuse sense circuit has a first transistor in a sense amplifier array of the memory block, a second transistor in a read decoder block of the memory block and a third transistor in an E-fuse cell of the E-fuse memory array.

6. The integrated circuit of claim 5 wherein each reference sense circuit is in a sense amplifier array of the memory block.

7. The integrated circuit of claim 1 wherein each E-fuse has an as-fabricated resistance and the reference resistance is at least ten times the as-fabricated resistance of the E-fuse.

8. The integrated circuit of claim 7 wherein the reference resistance is at least 1,000 Ohms.

9. The integrated circuit of claim 7 wherein the as-fabricated resistance is not greater than 100 Ohms.

10. The integrated circuit of claim 1 wherein each E-fuse has a first resistance before programming and a second resistance after programming, the reference resistance being a first difference from the first resistance and a second difference from the second resistance, the first difference being greater than the second difference.

11. The integrated circuit of claim 1 wherein each comparator is a differential amplifier.

12. The integrated circuit of claim 1 wherein each reference sense circuit tracks operation of the corresponding one of the plurality of E-fuse sense circuits over fabrication process variations, operating voltage variations, or operating temperature variations.

13. A method of operating an integrated circuit having an E-fuse memory array comprising:
enabling a read operation;
generating a read voltage during the read operation according to an E-fuse resistance of an E-fuse in the E-fuse memory array using a read sense circuit;
generating a reference voltage during the read operation according to a reference resistance of a reference resistor using a reference sense circuit replicating the read sense circuit;
wherein the reference sense circuit is one of a plurality of reference sense circuits disposed along a perimeter of the E-fuse memory array;
coupling the read voltage and the reference voltage to a comparator;
comparing the read voltage and the reference voltage to produce a bit value from the comparator; and
coupling the bit value to an output as an output value.

14. The method of claim 13 further comprising steps of latching the output value and then disabling the read operation so as to provide the output value at the output after the read operation has ended.

15. The method of claim 13 wherein the step of coupling the bit value to the output includes inverting the bit value.

16. The method of claim 13 wherein the reference sense circuit is coupled to a bitline of the E-fuse memory array and further comprising a step of selecting an E-fuse cell on the bitline.

17. The method of claim 14 further comprising, after disabling the read operation, steps of
selecting a second E-fuse cell on the bitline; and
coupling a second bit value to the output as a second output value.

18. An integrated circuit comprising:
a bitline;
an E-fuse memory array including a plurality of E-fuse cells coupled to the bitline;
a sense amplifier coupled to the bitline, the sense amplifier including a reference cell with a reference sense circuit disposed between a reference resistor and a comparator;
a bitline decoder coupled to the bitline; and
the comparator including a first NMOS transistor coupled to a first node from the reference cell and a second NMOS transistor coupled to the bitline decoder, the comparator comparing a READ voltage from the bitline decoder with a reference voltage of the first node.

19. The integrated circuit of claim 18 wherein a READ path exists between an E-fuse cell in the plurality of E-fuse cells and the reference sense circuit replicates the READ path.

20. The integrated circuit of claim 18 further comprising a sense amplifier array of a plurality of sense amplifiers including the sense amplifier, each of the plurality of sense amplifiers having a corresponding plurality of reference sense circuits and a plurality of reference resistors.

* * * * *